United States Patent [19]

Hemmati

[11] Patent Number: 5,594,742
[45] Date of Patent: Jan. 14, 1997

[54] BIDIRECTIONAL TRELLIS CODING

[75] Inventor: Farhad Hemmati, Darnestown, Md.

[73] Assignee: Communications Satellite Corporation, Bethesda, Md.

[21] Appl. No.: 453,092

[22] Filed: May 30, 1995

Related U.S. Application Data

[63] Continuation of Ser. No. 630,686, Dec. 20, 1990, abandoned.

[51] Int. Cl.⁶ .................................................. G06F 11/00
[52] U.S. Cl. ........................ 371/37.1; 371/38.1; 371/44
[58] Field of Search .............................................. 371/37.1

[56] References Cited

PUBLICATIONS

*The Viterbi Algorithm* by G. David Forney, Jr., Proceedings of the IEEE, vol. 61, No. 3, Mar. 1973, pp. 268–277.
*Trellis–Coded Modulation with Multidimensional Constellations* by Lee–Fang Wei, IEEE Transactions on Information Theory, vol. It–33, No. 4, Jul. 1987, pp. 483–501.
"Digital Communications" Second Edition by John G. Proakis ©1989 by McGraw–Hill Book Co., pp. 377–428.
"Integrated Algebra & Trigonometry" by Robert C. Fisher & Allen D. Ziebur ©1958 by Prentice–Hall, Inc. pp. 37–41 & 366–371.
"Digital Communications", 2nd Edition, by John Proakis, McGraw Hill Book Co. ©1989 pp. 440–459.

*Primary Examiner*—Vincent P. Canney
*Attorney, Agent, or Firm*—Sughrue, Mion, Zinn, Macpeak & Seas

[57] ABSTRACT

A block code decoding method finds the highest path metric path in a forward direction of a trellis diagram from an initial state of the trellis diagram to a final state. Next, the highest path metric path is found in a backward direction from the final state back to the initial state. The metrics of these two highest path metric paths are compared and the path having the absolute highest metric, in either direction, is chosen as a most likely path through the trellis diagram.

3 Claims, 15 Drawing Sheets

BIDIRECTIONAL TRELLIS CODING

This is a continuation of application Ser. No. 07/630,686 filed Dec. 20, 1990, now abandoned.

FIELD OF THE INVENTION

The present invention relates to the efficient soft decision decoding of block codes.

BACKGROUND OF THE INVENTION

In a recent paper (G. D. Forney, Jr. "Coset Codes II: Binary Lattices and Related Codes," *IEEE Trans. On Information Theory*, Vol. 34, No. 5, Sept. 1988, pages 1152–1187) Forney introduced an algebraic derivation of trellis diagrams for block codes. The trellis diagrams obtained in the Forney disclosure have a minimum number of states, and when used in conjunction with the Viterbi algorithm, provide efficient methods for maximum-likelihood (ML) soft-decision decoding of block codes. Computational efforts of a Viterbi algorithm decoder include branch metric calculations, Add/Compare/Select (ACS) operations, and trace back. The complexity of branch metric calculations can be minimized by using a basis for the generator matrix of the code such that fast transform techniques (e.g., the fast Hadamard transform), become applicable (See the above-mentioned Forney article, as well as S. P. Adoul, "Fast ML Decoding Algorithm for the Nordstrom Robinson Code," *IEEE Trans. On Information Theory*, Vol. IT-33, No. 6, Nov. 1987, pp. 931–33; and Y. D. Karyakin, "Fast Correlation Decoding of Reed-Muller Codes," *Problems of Information Transmission*, Vol. 23, No. 3, 1987, pp. 121–129.) For many codes, including the Golay code, with a large number of trellis states, the complexity of the ML decoder is dominated by the number of computations required for ACS operations. The prior art decoding schemes, thus, involve a high degree of complexity.

In a recent publication (F. Hemmati, "Closest Coset Decoding," ICC '88 Conf. Rec., June 1988), an efficient suboptimum method was disclosed by the present inventor for soft decision decoding of block codes. In closest coset decoding, the considered code is partitioned into a subcode and its cosets and, for a received block of channel symbols, R, first the decoder finds the coset which is closest to R. Next, the decoder decodes R in that coset. Computational complexity of the closest coset algorithm is less than the computational effort of the coset decoding method (see J. H. Conway and N. J. A. Sloane, "Soft-Decision Techniques for Codes and Lattices, Including the Golay Code and the Leech Lattice" *IEEE Trans. On Information Theory*, Vol. IT-32, No. 1, Jan. 1986, pp. 41–50), in which R is decoded in every coset.

SUMMARY OF THE INVENTION

It is an object of the present invention to provide a decoding method for block codes, such a decoding method being more efficient than the above-mentioned conventional decoding methods.

In this invention disclosure, a bidirectional decoding algorithm is introduced for decoding block codes. Bit error rate (BER) performance of the bidirectional decoding algorithm and the Maximum Likelihood Viterbi algorithm are equivalent. Unlike the Viterbi algorithm, which processes every trellis state, the bidirectional decoding algorithm takes advantage of the structure of the considered code to identify and process a small subset of paths in the trellis diagram containing the most likely path. As a result, the number of computations required for ACS operations and/or complexity of branch metric computation are significantly reduced.

The bidirectional decoding algorithm along with the closest coset decoding procedure, described above, provide a very efficient decoding technique for several classes of block codes including the Reed-Muller codes.

The bi-directional decoder first finds the highest path metric path in a forward direction through a trellis diagram representation of the code from an initial state of the diagram to a final state. Next, the highest path metric path in a backward direction, i.e., from the final state to the initial state is found. The metrics of these two paths are compared and the path having the highest metric is chosen as a most likely path through the trellis diagram.

BRIEF DESCRIPTION OF THE DRAWINGS

The present invention will be more clearly understood from the following description in conjunction with the accompanying drawings, wherein.

DETAILED DESCRIPTION OF THE PREFERRED EMBODIMENTS

In the following sections a bidirectional decoding algorithm is introduced. An algorithm for block codes with a three stage trellis diagram is introduced first. Then, an algorithm for block codes with a four stage trellis diagram will be described. Generalization of the algorithm for decoding codes with more trellis stages is then straight-forward.

BLOCK CODES WITH A 3-STAGE TRELLIS DIAGRAM

Let $C=(3n, k, 2d)$ be a binary linear block code of length $3n$, dimension $k$, and minimum Hamming distance $2d$, whose generator matrix in the "trellis oriented" form i.e., the form disclosed in the Forney publication, can be written as $$G = \begin{bmatrix} G_1 & 0 & 0 \\ 0 & G_1 & 0 \\ 0 & 0 & G_1 \\ G_2 & G_2 & 0 \\ 0 & G_2 & G_2 \end{bmatrix}$$

where, $G_1$ is a $k_1$ row by n column matrix, $G_2$ is a $k_2$ row by n column matrix, $k=3k_1+2k_2$, and rows in $G_1$ and $G_2$ are linearly independent. In general the entries represented by submatrices, $G_1$ or $G_2$ might be different. However, the above form for G is selected to simplify notations. Also, G might include additional rows with arbitrary patterns of 0s and 1s such as in the generator matrix for the extended Golay code which will be described below. Before presenting the bidirectional decoding algorithm for C, structural properties of the above code will be discussed.

Figure 1:
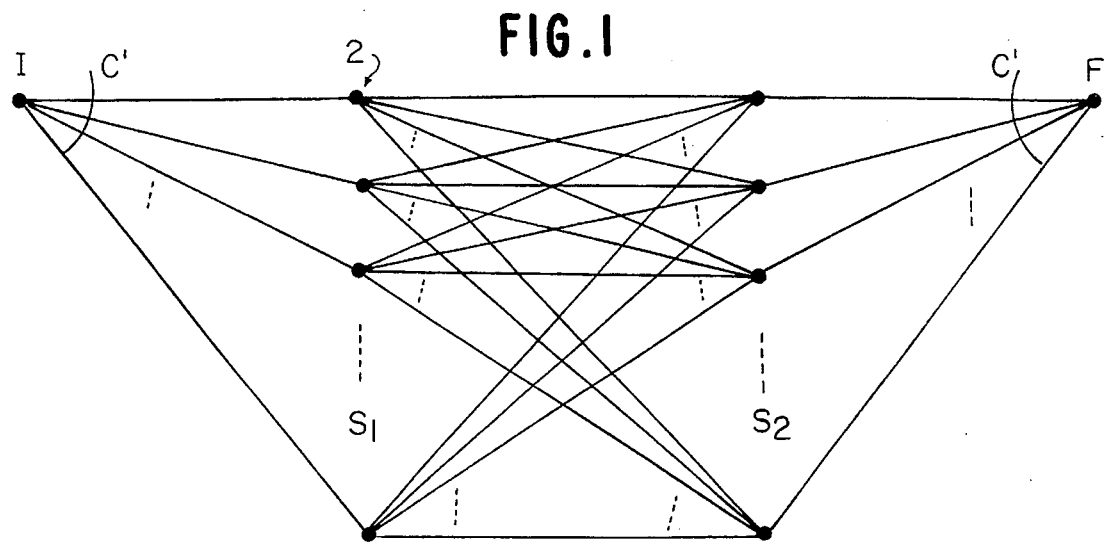
FIG. 1 shows a three-stage trellis diagram to which the inventive decoding method is to be applied.

The set of $2^k$ codewords in C can be represented by a full-connected $2^{k_2}$ state trellis diagram consisting of only three trellis stages. The states are represented by dots 2 in FIG. 1. FIG. 1 shows the structure of the trellis diagram for C where transitions between trellis states 2 are by $2^{k_1}$ parallel branches, representing the $2^{k_1}$ codewords generated by $G_1$. That is, $2^{k_1}$ parallel branches connect any two states, and there are thus $2^{k_1+k_2}$ total branches leaving the first stage, i.e., the stage labelled I.

A codeword in C is identified by a sequence of states (I, $s_1$, $s_2$, F), where I and F are the initial and final states and $s_1$ and $s_2$ are intermediate states of the three step trellis diagram shown in FIG. 1. In the following disclosure a path shall be denoted, in a 3-stage trellis, by the sequence of states ($s_1$, $s_2$), as the initial and the final state are trivially common in every path. Also, $s_1$ ($s_2$) denotes a specific state or the set of all states between the first and second (second and third) trellis stages.

Let $C'=(n, k_1+k_2, d')$ be a binary block code with generator matrix $$G' = \begin{bmatrix} G_1 \\ G_2 \end{bmatrix}$$

and minimum distance $d'=d$. The inventive algorithm B1 for decoding C, is based on the following property: The $2^{k_1+k_2}$ branches stemming from or terminating in each trellis state represent the $2^{k_1+k_2}$ codewords in C'.

BIDIRECTIONAL DECODING ALGORITHM B1 FOR A THREE STATE TRELLIS DIAGRAM

Let $R=(r_1, r_2, r_3, \ldots, r_{3n})$ be a block of 3n received BPSK channel symbols corresponding to a transmitted codeword in C. It is assumed that the code symbols, 0 and 1, are modulated into waveforms 1 and $-1$ and metrics are computed by taking the scalar product of $R_1=(r_1, r_2, r_3, \ldots, r_n)$, $R_2=(r_{n+1}, r_{n+2}, r_{n+3}, \ldots, r_{2n})$, and $R_3=(r_{2n+1}, r_{2n+2}, r_{2n+3}, \ldots, r_{3n})$, with codewords in C'. Moreover, the best element, among the set of $2^{k_1}$ parallel branches between two states, and the corresponding metric are used in the "main" decoder. The bidirectional decoding algorithm takes the following steps to decode R.

Step 1. Use any efficient Maximum Likelihood ML) decoding method to find the codeword in C' which is closest to $R_1$ (the closest codeword will have the highest path metric). The output of this step is a branch from I to an intermediate state $s_1$ and the corresponding metric is $m_1$. $s_1$ uniquely identifies the set of all possible paths from $S_1$ to F.

Step 2. Decode $R_2R_3$ by computing metrics for every possible path from $s_1$ to F and select the best one (i.e., the path having the highest path metric) having path metric $m_2$. Let $s_2$ be the selected intermediate state from $s_1$ to F. Then, set $m=m_1+m_2$ and $D=(s_1, s_2)$.

Step 3. Use an efficient ML decoding method to find the codeword in C' which is closest to $R_3$. The output of this decoding step is a branch from F to an intermediate state $s'_2$ and the corresponding metric $m'_2$. $S'_2$ uniquely identifies the set of all possible paths from $s'_2$ to I Step 4. Decode $R_1R_2$ by computing metrics for every possible path $s'_2$ to I and select the best one having path metric $m'_1$. Let $s'_1$ be the selected intermediate state from $s'_2$ to I Set $m'=m'_1+m'_2$ and $D'=(s'_1, s'_2)$.

Step 5. If $m'>m$ set $D=D'$ and go to Step 6, otherwise,

Step 6. Stop. D is the decoded path.

Figure 2:
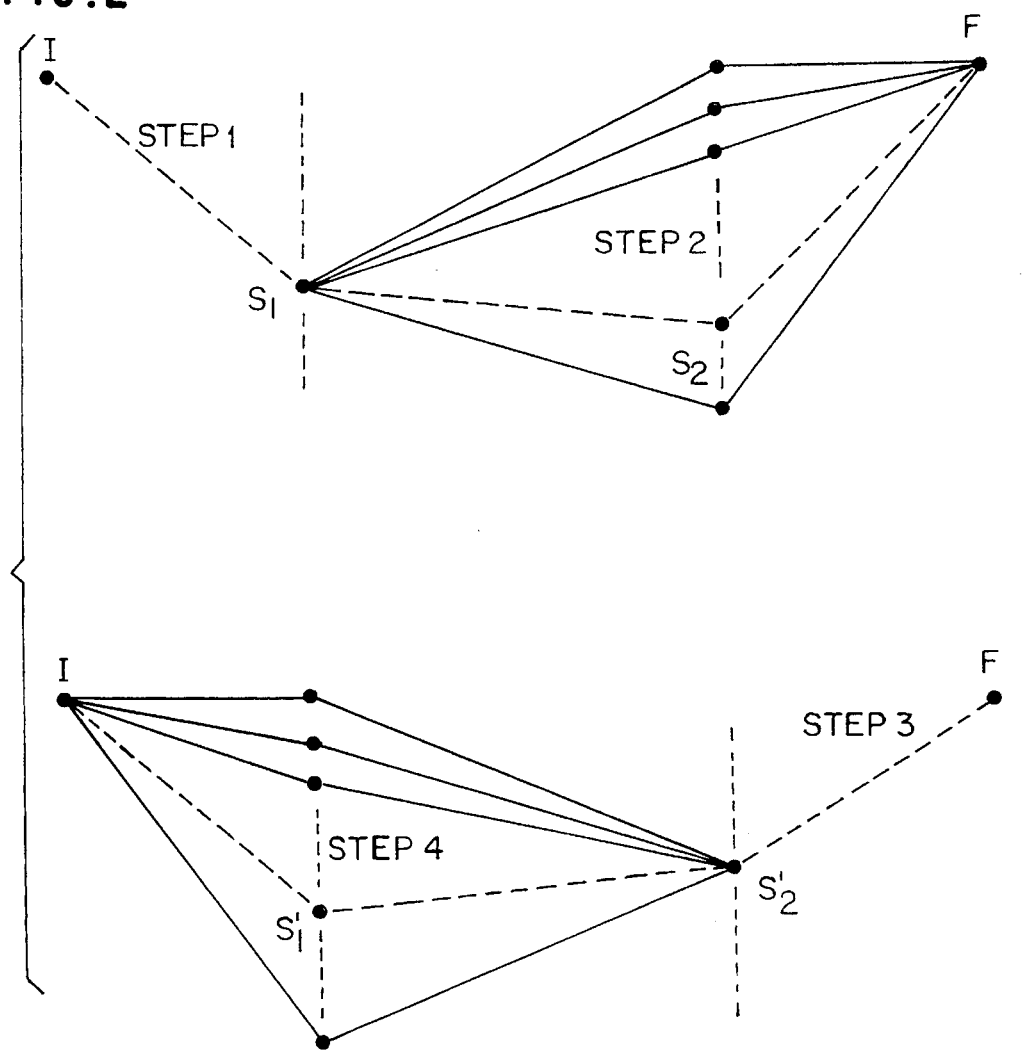
FIG. 2 shows the relationship between the decoding steps of the present invention and the trellis diagram of FIG. 1.

FIG. 2 is a visual help to follow the operations performed by algorithm B1. Steps 1 and 2 in this algorithm decode R in the forward direction while steps 3 and 4 decode R in the backward direction.

Operations performed by the bidirectional decoding algorithm include decoding the small code C' two times (in Steps 1 and 3) and processing only two states in the trellis diagram of C (Steps 2 and 4). This must be compared to the computational complexity of the Viterbi algorithm which processes $2^{k_2}+1$ states. In the following example the bidirectional decoding algorithm B1 is used for decoding the extended Golay code.

EXAMPLE 1

The Extended Golay Code

The extended Golay (24,12,8) code, XG, is one of the most important block codes and is of both theoretical and practical interest. Among several soft-decision schemes for decoding XG, as taught in Forney, Conway et al., and Hackett ("An Efficient Algorithm for Soft Decision Decoding of the (24, 12) Extended Golay Code," *IEEE Trans. on Comm.*, Vol. COM-29, pp. 909–911, 1981, and Vol. COM-30, p. 554, 1982), Forney's trellis decoding method is the most efficient. In the following, first the trellis structure of XG is discussed, then the bidirectional decoding algorithm for soft-decision decoding of this code according to the invention is explained. The generator matrix, G, for the extended Golay code obtained by Turin's |a+x| b+x| a+b+x| construction method as described in MacWilliams et al., "The Theory of Error-Correcting Codes," Amsterdam, The Netherlands: North Holland, 1977, and in the "trellis oriented" form as taught in the Forney reference:

$$G = \begin{bmatrix} 11111111 \\ \phantom{0000}11111111 \\ \phantom{00000000}11111111 \\ 1111000011110000 \\ 1100110011001100 \\ 1010101010101010 \\ \phantom{0000}1111000011110000 \\ \phantom{0000}1100110011001100 \\ \phantom{0000}1010101010101010 \\ 011110000111100001111000 \\ 100111001001110010011100 \\ 010101100101011001010110 \end{bmatrix}$$

Figure 3:
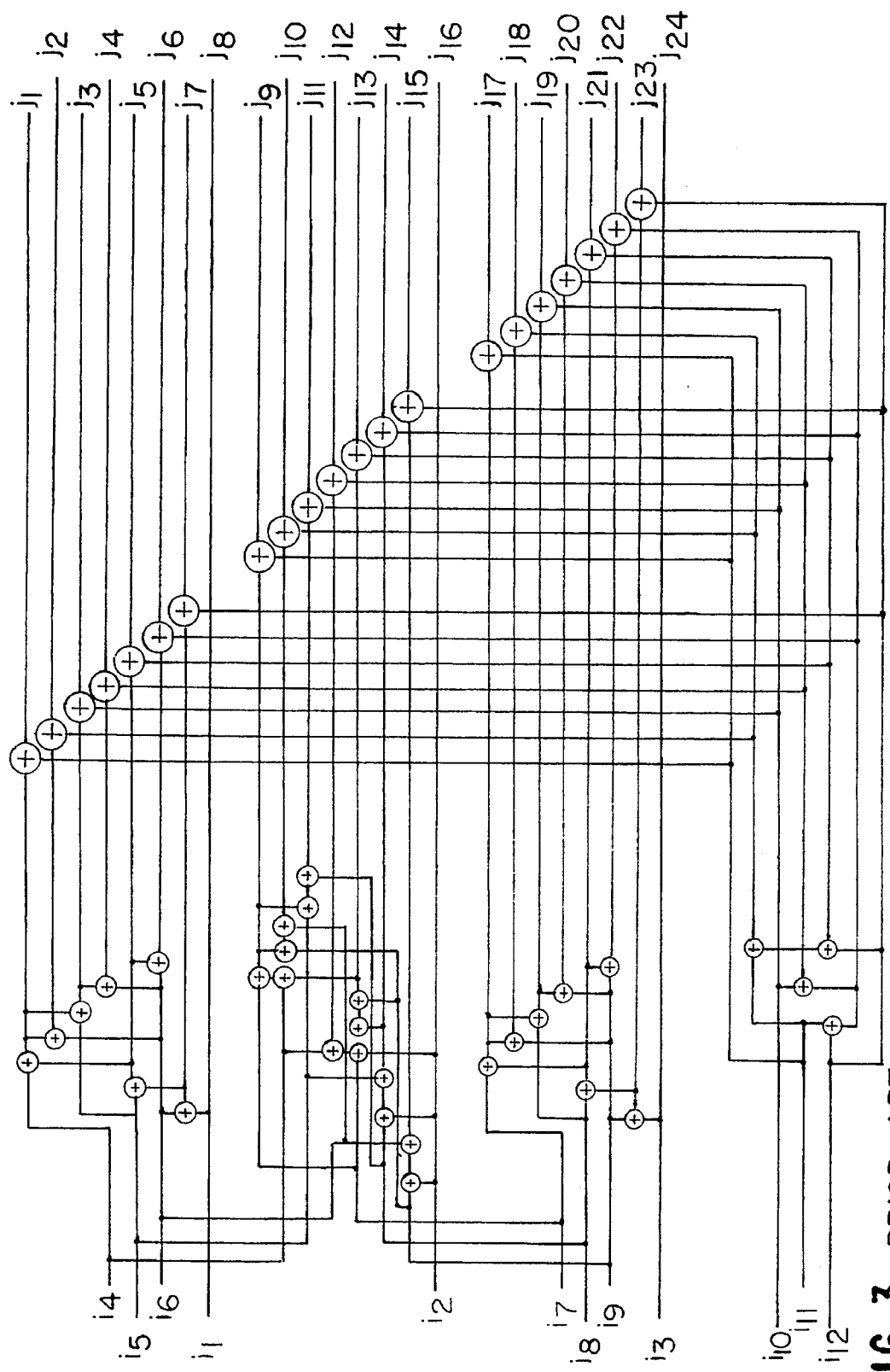
FIG. 3 shows an encoder for encoding the Golay code.

FIG. 3 is a block diagram for the encoder of the Golay code with generator matrix G using a minimum number of modulo-two adders. The binary information bits are denoted by $(i_1, i_2, \ldots i_{12})$. $(j_1, j_2, \ldots, j_{24})$ is a block of 24 encoded bits.

Figure 4A:
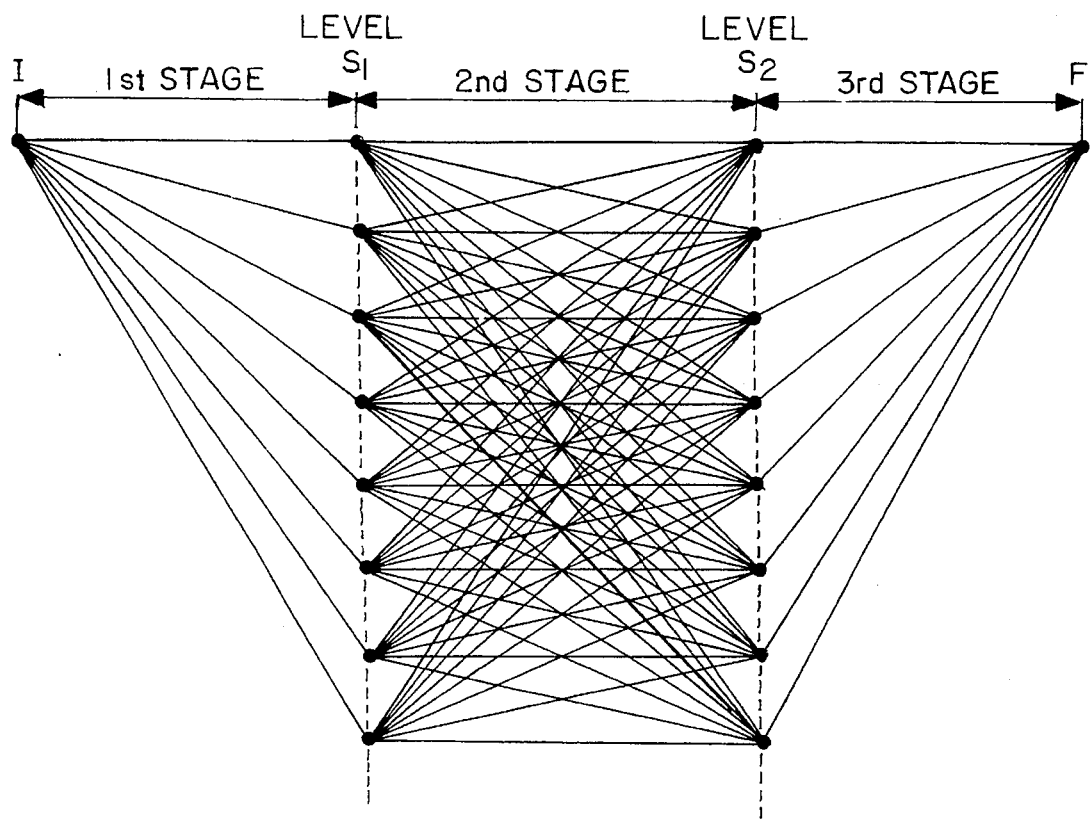
FIG. 4(a) shows a detailed three-stage trellis diagram for codewords generated by a subcode of the Golay code.

Let $G_0$ be a (24, 9, 8) code generated by the first 9 rows of G. The set of $2^9$ codewords generated by $G_0$ can be represented by $T_0$, a 3-stage 8-state trellis diagram, since, here $k_2=3$ and thus $2^{k_2}=2^3=8$, as shown in FIG. 4(a), where transitions between trellis states are by double branches, since $k_1$, here, is equal to one and thus $2^{k_1}=2^1=2$. The set of 16 (i.e., $2^{k_1+k_2}=2^{k_1}2^{k_2}=2^1 2^3=16$) branches stemming from (or terminating in) each state forms a C'=(8, 4, 4) code with generator polynomial $$G' = \begin{bmatrix} 11111111 \\ 11110000 \\ 11001100 \\ 10101010 \end{bmatrix}$$

Figure 4B:
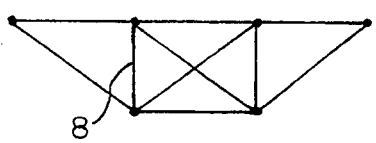
FIG. 4(b) shows a schematic representation of the trellis diagram of FIG. 4(a)

FIG. 4 (b) shows a schematic representation of the detailed trellis diagram shown in FIG. 4(a).

The set of $2^{12}$ codewords in XG are the $2^9$ codewords generated by $G_0$ and the $2^{12}-2^9$ codewords generated by the 7 cosets of $G_0$. The 8 coset representatives (including the all-zero sequence) is a (24,3,8) binary code

Figure 5:
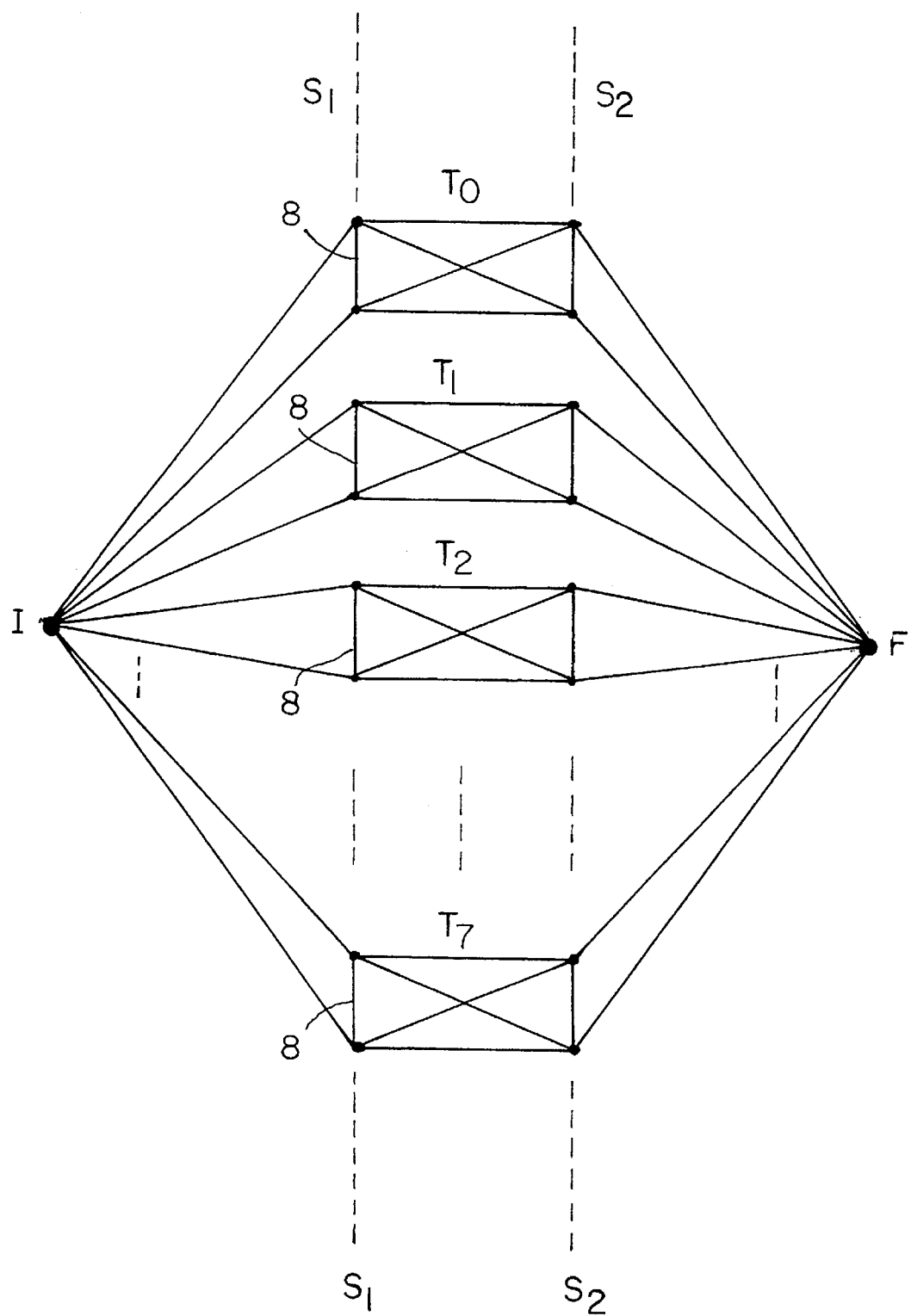
FIG. 5 shows a schematic representation of the complete trellis diagram for the Golay code.

```
000000000000000000000000
011110000111100001111000
100111001001110010011100
111001001110010011100100
010101100101011001010110
001011100010111000101110
110010101100101011001010
101100101011001010110010
``` generated by the last 3 rows of G. Thus, the 8 coset representatives are the $2^3=8$ codewords of a subcode whose generator matrix is made up of the last three rows of G. Hence the set of $2^{12}$ codewords in XG can be represented by a 64-state 3-stage trellis diagram which is the union of $T_0$, the trellis diagram for $G_0$, and its seven replicas $T_1, T_2, \ldots, T_7$. FIG. 5 is a trellis diagram for XG (in schematic form) with a minimum number of states.

In the following we examine complexity of computations for decoding XG, the extended Golay code, using algorithm B1 set forth above (i.e., the three stage trellis situation). The decoding procedure is based on the concept of coset codes. That is, algorithm B1 is used eight times, one time for each trellis chain $T_i$, $0 \leq i \leq 7$ as discussed fully above. In each iteration a path, $D_i$ in $T_i$, which is closest to R and its corresponding metric, $m_i$, are generated. Next, the eight metrics are compared, and a path is chosen among the eight paths $\{D_i\}$ with the best metric. The bidirectional decoding algorithm B1 requires a total of 647 binary operations, 264 additions or subtractions for branch metric calculations (the same as that for Viterbi decoding) and only 383 additions or comparisons for the ACS operations, namely;

i) with all the branch metrics at hand 7 comparisons are required to decode $R_1$ in $C_1$ and 7 comparisons to decode $R_3$ in $C_1$ for a total of 14 comparisons. This must be repeated 8 times, one time in each decoding iteration (8×14=112 comparisons).

ii) Processing two trellis states which involve 2×8=16 additions and 2×7=14 comparisons. In 8 iterations this process requires a total of 8×16=128 additions and 8×14=112 comparisons (128 +112=240 binary operations).

iii) Finally, 8×2=16 additions for computations of intermediate path metrics (in Steps 2 and 4) and 8×1 comparisons (in Step 5), plus seven comparisons to make the final decoding decision (31 binary operations).

Advantages of the bidirectional decoding algorithm are evident. It reduces the computational effort of the ACS (add/compare/select) units from 1,087 to only 383 binary operations. This is a significant result especially for high-speed applications.

A full parallel implementation of the bidirectional decoding algorithm involves 647 binary computations for decoding a codeword in XG while Forney's decoding method requires 1,351 binary computations. Full parallel implementation of the branch metric calculators takes only 3×88=264 additions or subtractions, (see Forney's disclosure), and is useful for high speed applications if eight bidirectional decoders (one for each coset) are used in parallel. However, the full parallel implementation of the decoder requires excessive wiring and interconnections among a large number of processing nodes which might be undesirable.

A serial implementation of the decoder is more cost effective than the parallel implementation. The serial procedure for decoding XG is based on the concept of coset codes as described in MacWilliams et al. where algorithm B1 is used eight times, one time for each trellis chain $T_i$, $0 \leq i \leq 7$ (i.e., one time for each coset). In each iteration a path, $D_i$ in $T_i$, which is closest to R and its corresponding metric, $M_i$, are generated. Next, the eight metrics, $\{M_i\}$, are compared and a path among the eight paths $\{D_i\}$ with the best metric is selected.

Figure 6:
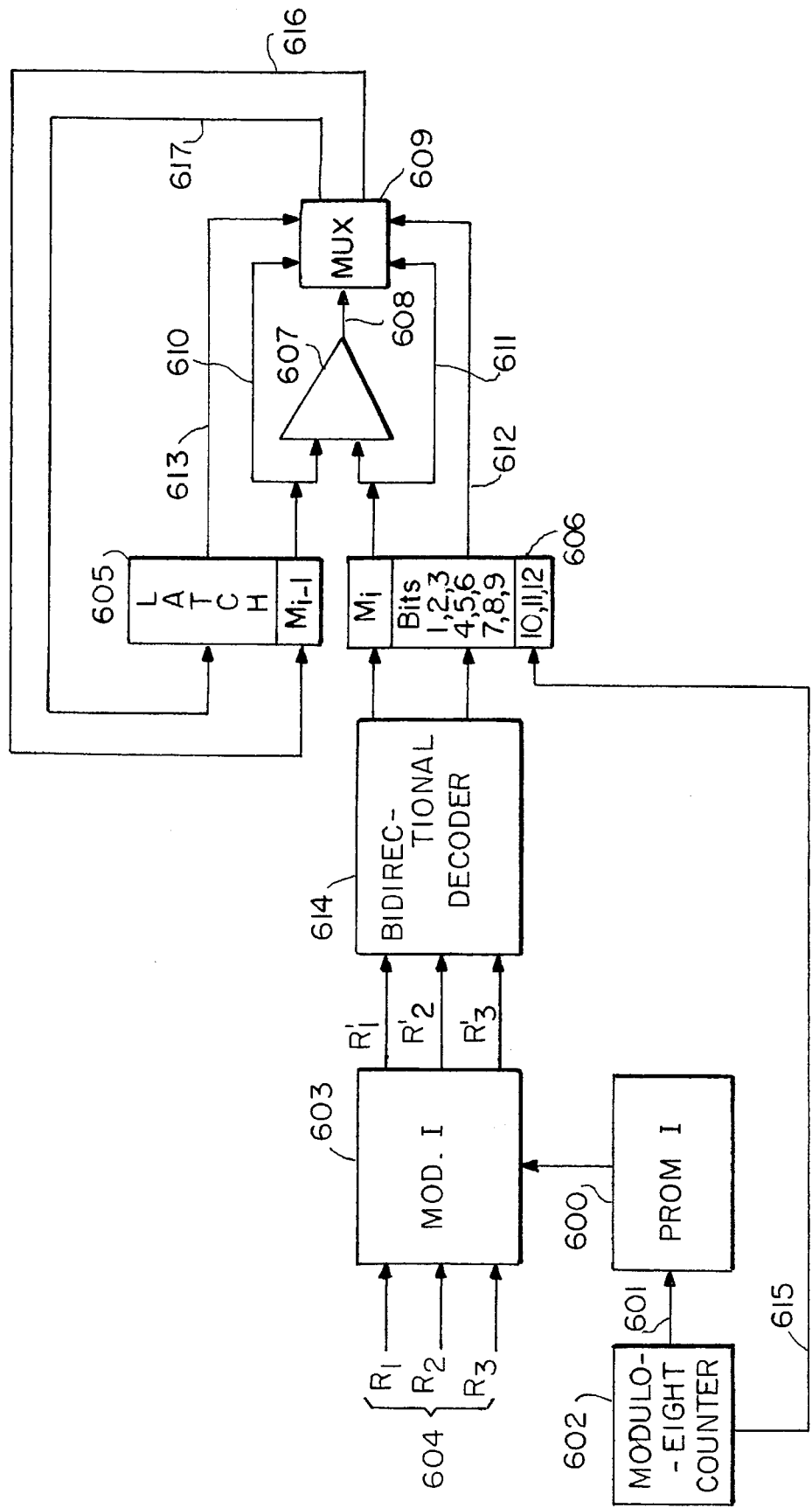
FIG. 6 shows a block diagram for a serial decoder for the Golay code.
Figure 7:
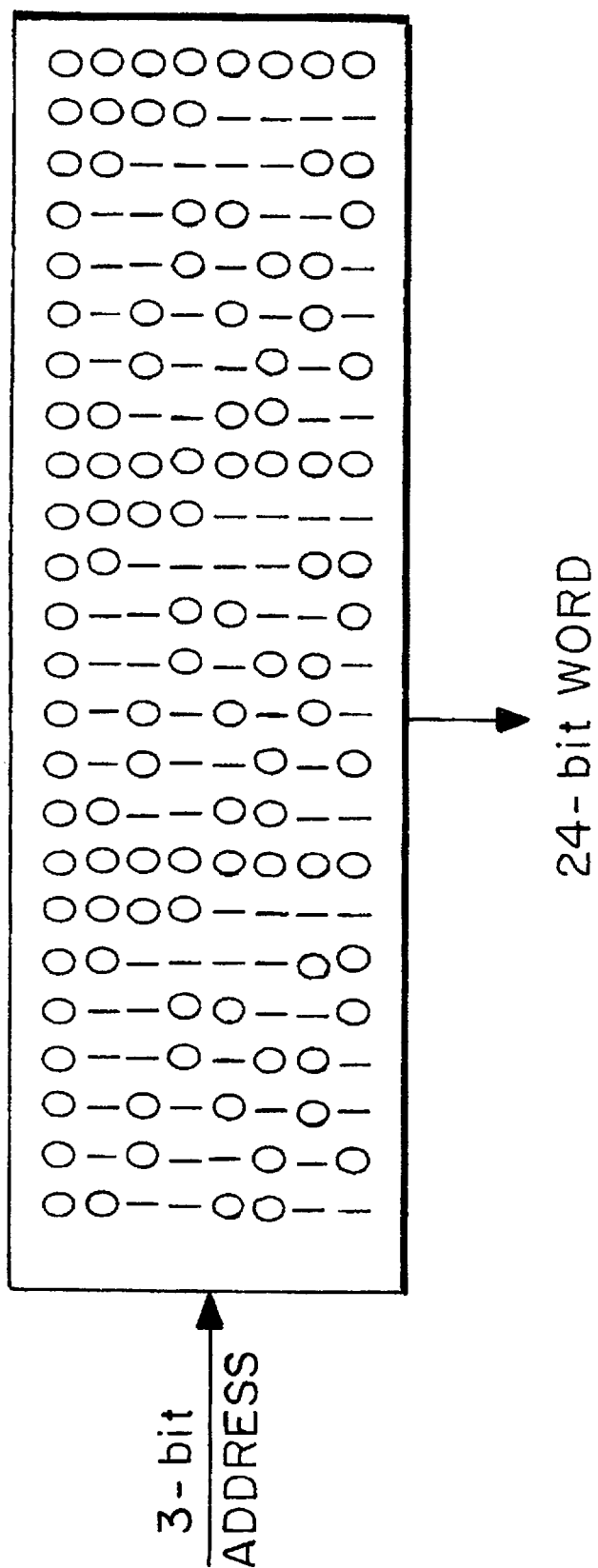
FIG. 7 shows the contents of a look-up-table in FIG. 6.
Figure 8A:
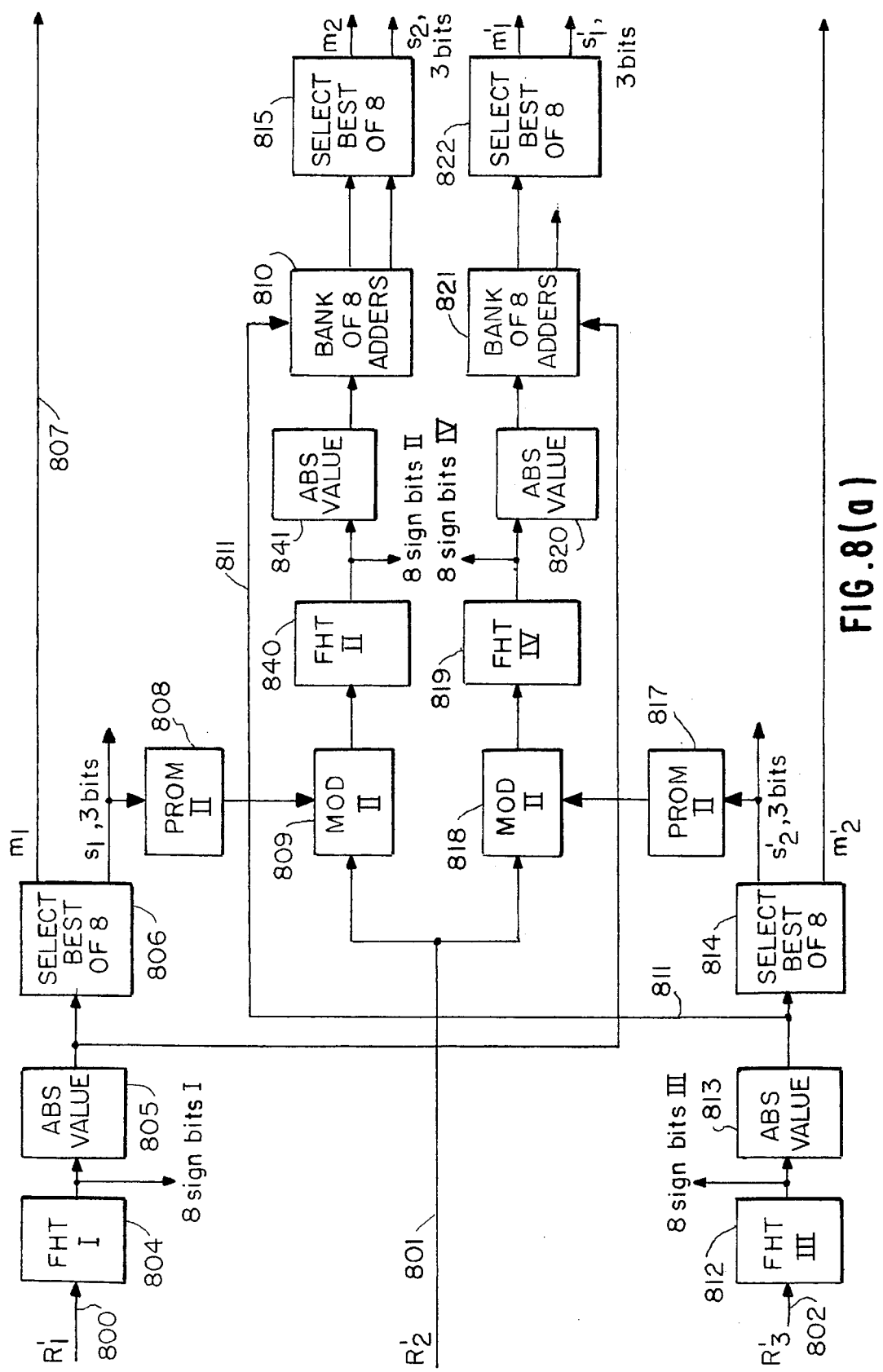
FIGS. 8A & B shows the details of a bi-directional decoder of FIG. 6.
Figure 8B:
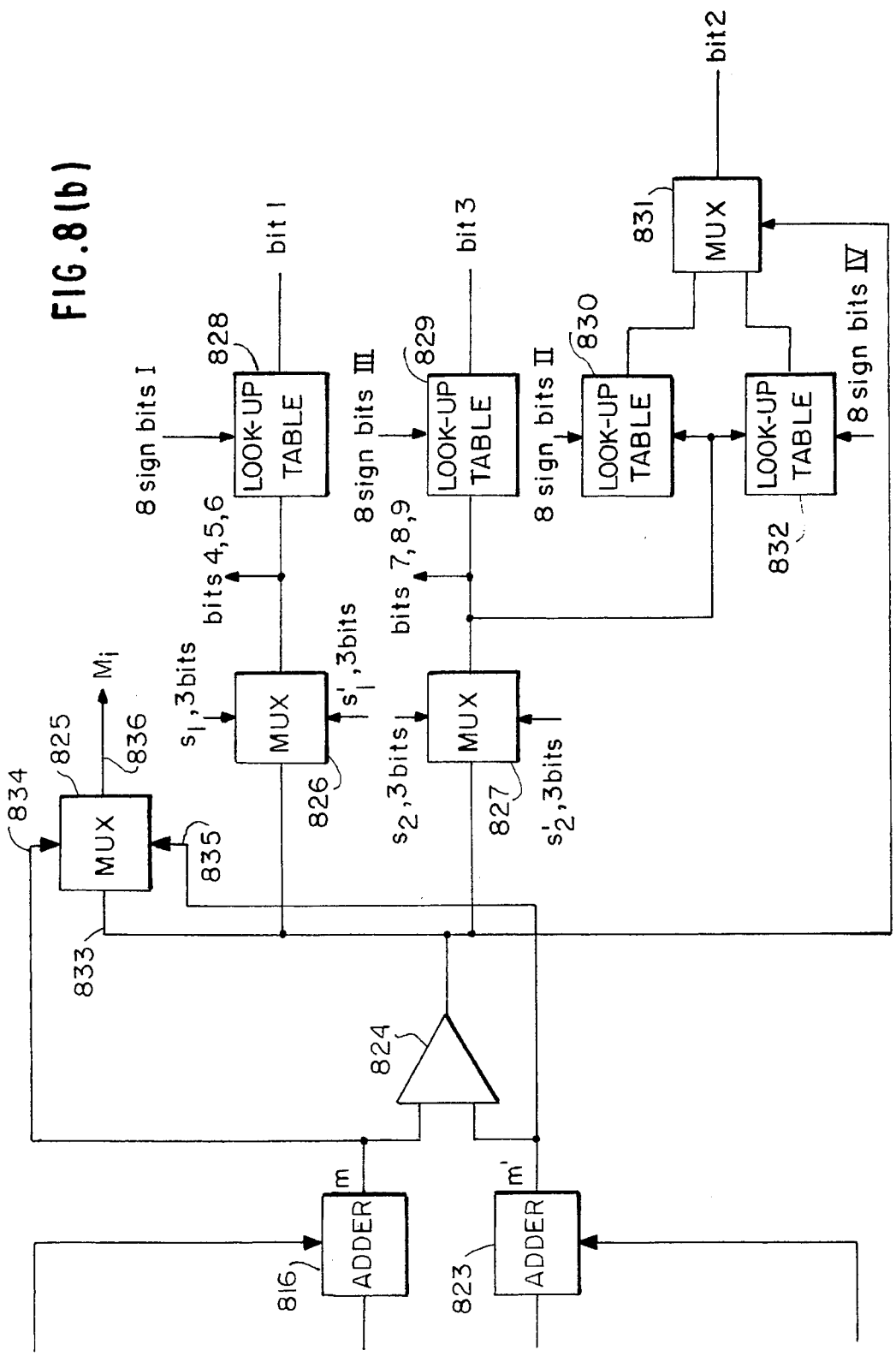

FIG. 6 shows a block diagram for serial implementation of the decoder for the extended Golay code. The contents of the look-up table-PROM I 600 are the eight 24 bit coset representatives generated by the last three rows of G and are read out serially according to the 3-bit addresses, supplied on line 601, generated by a modulo-eight counter 602. The content of the PROM I 600 are shown in FIG. 7. Eight clock intervals, or counts, of the modulo-eight counter are equal to the time period to receive one codeword consisting of 24-channel symbols. Each channel symbol is represented by its sign and magnitude. At each count of the modulo-eight counter 602, the block 604 of 24 received channel symbols, $R=(R_1, R_2, R_3)$, is "modulated" with one of the coset representatives stored in PROM I 600 to generate $R'=(R'_1, R'_2, R'_3)$. A modulator I 603 is a bank of 24 modulo-two adders. Each modulo-two adder changes the sign of a channel symbol if the corresponding bit in the coset representative is a "1"; otherwise, the sign of that channel symbol remains unchanged. The bidirectional decoder 614 in FIG. 6 uses algorithm B1 and its detailed block diagram is shown in FIG. 8. During each count of the modulo-8 counter the bidirectional decoder generates estimates for the 12 information bits and a path metric $M_i$ and stores these values in latch 606. Initially $M_{i-1}$ is set to $-\infty$ and at the end of the 8th clock count the 12 decoded bits are stored in the LATCH 605 in FIG. 6.

At the end of each 8th clock count cycle, the value $M_i$ of the best path metric for the presently accessed coset is compared, by comparator 607 with the best path metric $M_{i-1}$ (stored in latch 605) for the preceding cycle. The highest metric (of $M_i$ or $M_{i-1}$) is sent along line 608 as a control input to a Multiplexer (MUX 609).

The Multiplexer (MUX 609) also receives four data input values. The first two data input values which are input to the MUX along lines 610 and 611 are the best path metrics $M_{i-1}$ and $M_i$ respectively which were discussed above. The other two input values which are input to the MUX along lines 612 and 613 are each a series of bits representative of the particular path through the three-stage trellis which corresponds to the best path metrics $M_i$ and $M_{i-1}$, respectively, discussed above. Each series of bits is made up of a first group of nine bits which are taken directly from the bidirectional Decoder 614 output and a second group of three bits which is taken from the output 615 of the Modulo-Eight-Counter 602 and which corresponds to count values of the counter. That is, the counter 602 outputs its count values on both lines 601 and 615 simultaneously.

The nine bits in the first group correspond to estimates for nine information bits encoded by the first nine rows of the generator matrix G of the code XG. The three bits in the second group correspond to estimates for three information bits encoded by the last three rows of G. These twelve bits represent the information bits corresponding to a particular path through the three-stage-trellis diagram.

If the comparator 607 determines that $M_i > M_{i-1}$, then the MUX 609 selects the path metric $M_i$, input to the MUX on line 611, to be output onto MUX output line 616 to be sent to latch 605, and so as to select the corresponding twelve information bits (corresponding to path metric $M_i$), which were input to the MUX 609 along line 612, to be output onto line 617 to be sent to latch 605. If the comparator 607 decides the $M_{i-1} > M_i$, the present values of latch 605 are unchanged, i.e., the present values are sent back to the latch 605 through the MUX outputs 616 and 617.

In this way, at the end of each eight clock count cycle, the highest path metric value of all of the eight cosets will be stored in latch 605.

FIG. 8 shows the details of the inventive bidirectional decoder, and these details will now be explained.

The outputs ($R_1'$, $R_2'$, $R_3'$) of Modulator I 603 in FIG. 6 are supplied as inputs to the bidirectional decoder 614, as shown in FIG. 8, on lines 800, 801 and 802, respectively. The first bits $R_1'$ of the modulated received word R' are input to Fast Hadamard Transformer, FHT I 804, which correlates the received bits in a well known manner, using a correlation structure shown in FIG. 9, in order to calculate branch metrics for each branch extending from initial point I in the trellis diagram of FIG. 4 to the states at the position labelled $S_1$. These branch metrics relate to the "degree of fit" or "closeness" between the received block of eight bits and each of the possible codewords of the code C' whose generator matrix G' was set forth above. $2^{k_1+k_2}=2^{1+3}=2^4=16$ codewords are possible with respect to code C'. These sixteen codewords are representable as the eight double branches shown in FIG. 4 connecting state I with all of the states represented by the term $S_1$.

Figure 9:
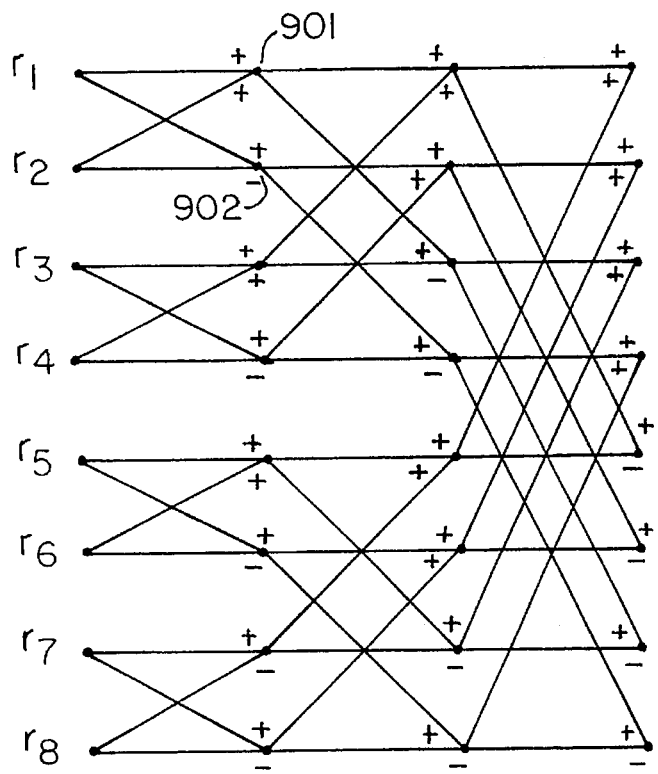
FIG. 9 shows the details of a Fast Hadamard Transform Network of FIG. 8.

The FHT I 804 of FIG. 8, which is shown in detail in FIG. 9, processes the eight received bits $r_1$ through $r_8$ by adding and subtracting the bits from each other in various combinations. For example, at point 901 the bits $r_1$ and $r_2$ are added together and at point 902 the bits $r_1$ and $r_2$ are subtracted.

This operation is called an eight point fast Hadamard transformation and is well known as evidenced by the Forney publication mentioned above.

The output of the FHT I 804 is eight different branch metrics for each of the $2^{k_2}=2^3=8$ pairs of branches stemming from initial point I in the trellis diagram of FIG. 4. Sign bit information is next tapped off of the FHT I output and the magnitude and sign information is input to an absolute value circuit 805. The absolute values of the branch metrics are then sent to a select best of eight circuit 806 which chooses the maximum-valued branch metric and outputs it onto line 807 as the value $m_1$. The associated state $s_1$, to which the branch having the highest branch metric extends on its way from the initial state I to the end $S_1$ of the first stage of the trellis diagram of FIG. 4, is also output from the select best of eight circuit 806. The above stated operation completes Step 1 in the above-set-forth bidirectional decoding algorithm.

Figure 10:
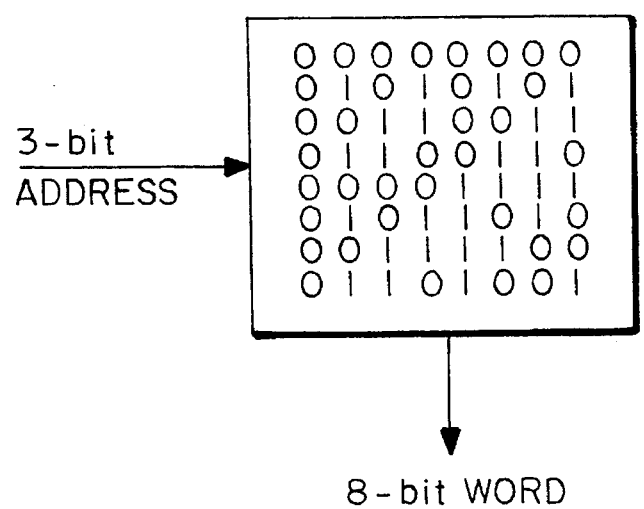
FIG. 10 shows the details of a look-up-table of FIG. 8.
Figures 11, 12:
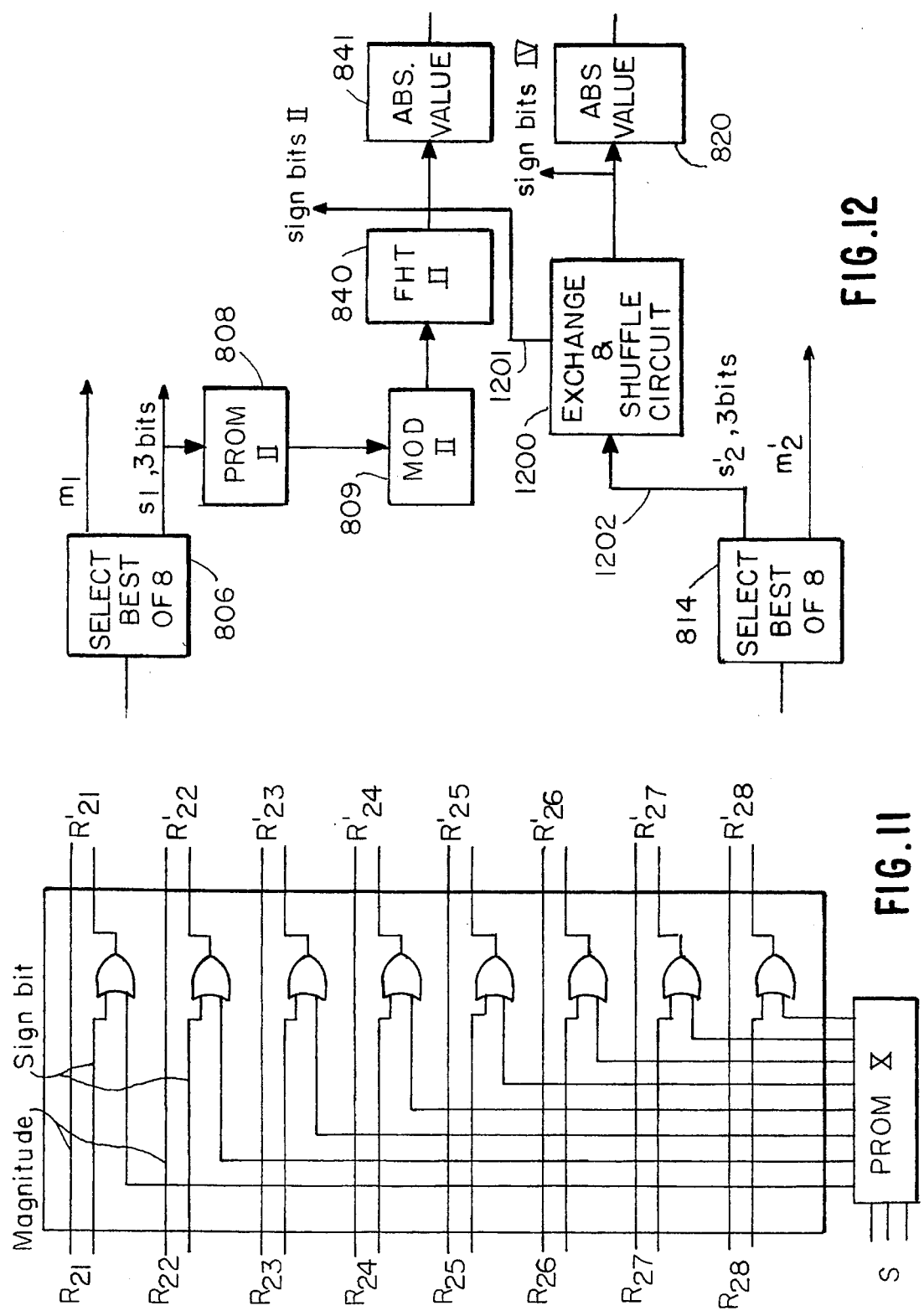
FIG. 11 shows the details of a modulator of FIG. 8.
FIG. 12 shows an alternative embodiment of the decoder of FIG. 8.

In order to execute Step 2 in the algorithm, the second group $R'_2$ of eight received and modulated bits is sent along line 801 to modulator MOD II 809 which also receives an input from a memory unit PROM II 808. The MOD II 809 is a bank of eight modulo-two adders as shown in FIG. 11. The PROM II 808 stores the eight codewords, or coset representatives, generated by G' as shown in FIG. 10 and outputs the codewords one-at-a-time depending on a three bit address representing the state $s_1$, described above, which was selected by the select best of eight circuit 806 in Step 1 of the algorithm.

In the trellis diagram of FIG. 4 the codewords of C' with respect to each branch stemming from a state at level $S_1$ to all of the eight states of level $S_2$ are arranged in a certain order, i.e., the first branch gets one certain codeword, the second branch gets another codeword, and so on. Also, the codewords of C' with respect to each branch stemming from another state at level $S_1$ to all of the eight states of level $S_2$ are arranged in a different order than the above-stated "certain" order. That is, for each of the eight states of level $S_1$, there are eight branches (where each branch is a double branch as stated above) stemming from a state of level $S_1$ to all of the eight states of level $S_2$. These eight double branches stemming from each state of level $S_1$ represent the $16=2^{k_1+k_2}=2^{1+3}=2^4$ codewords of C' having generator matrix G'. However, the codewords on the branches are arranged in different orders, i.e., the codeword/branch pairing of the first state of level $S_1$ is not the same as the codeword/branch pairing of the second state of level $S_1$.

The function of the MOD II 809 and the PROM II 808, then, is to rearrange the codewords so that they are arranged in the order of the selected state $s_1$ of level $S_1$ selected by selector 806 during Step 1 of the algorithm. The output of the modulator 809 is thus the re-modulated bits $R'_2$ which are next input to FHT II 840 which performs the same function as FHT I 804, that is, the branch metrics of the branches from state $s_1$ at level $S_1$ to all of the states of level $S_2$ are computed. After tapping off the sign bits for later use, and taking the absolute value, the branch metrics are sent to a Bank of Eight Adders 810 which also receives similar information along line 811 with respect to the last eight bits $R'_3$, input on line 802, of the 24-bit received word R. This information relates to the branch metrics from the selected state $s_1$ to the final state F.

The Bank of Eight adders 810 adds up the two sets of eight branch metrics to obtain eight path metrics corresponding to paths extending from state $s_1$ of level $S_1$ through each state of level $S_2$ and on to final state F at the end of Stage 3. Then, a Select Best of Eight circuit 815 selects the highest value of these path metrics to obtain $m_2$ and corresponding state $s_2$ belonging to level $S_2$, such a state $s_2$ being the state through which the path with the highest path metric passes through on its way from $s_1$ to $s_2$ and on to F, spanning the second and third stages of the trellis diagram of FIG. 4. The value $m_2$ is sent to adder 816.

The already computed value $m_1$ is also sent to adder 816 and the output m of adder 816 is the sum of $m_1$ and $m_2$. Thus, m represents the sum of the branch metric $m_1$, which relates to the highest metric branch extending from I to $s_1$, and a path metric $m_2$, which relates to the highest metric path from $s_1$ to F. The above stated calculations relate to Step 2 in the bi-directional decoding algorithm. Steps 1 and 2 represent the forward decoding operation which is one-half of the inventive bidirectional decoding algorithm.

Now, the second half, known as the backward decoding operation, of the bi-directional decoding algorithm will be described. This operation is exactly the reverse of the forward decoding operation discussed above. The backward decoding operation will process steps 3 and 4 which were set forth above.

In performing the backward decoding operation, first, the last eight bits $R'_3$ of the 24-bit received word R are input on line 802 and FHT III 812, absolute value circuit 813, and Select Best of Eight circuit 814 perform similar functions to the corresponding elements related to the first eight bits $R_1'$ of the 24-bit word R as described above. That is, the FHT III 812 calculates the branch metrics for the branches from final state F back to all of the states at level $S_2$ and the Select Best of Eight circuit 814 selects the branch with the highest branch metric $m'_2$ along with the corresponding three-bit representation of the specific state $s'_2$ at level $S_2$ at which the highest metric branch terminates as it protrudes from final state F. The above operation describes Step 3 of the algorithm.

The metric $m'_2$ is sent to single stage adder 823 which will be described later. The three bits $s'_2$ are sent as addresses to PROM II 817 which performs the same function as PROM II 808 discussed above. That is, PROM II 817 stores the eight codewords generated by generator matrix G' of code C'. The selected codeword is sent to MOD II 818 which performs the same relative function as MOD II 809 described above. That is, MOD II 818 takes the second group of eight bits $R'_2$ and performs modulo-two addition (i.e., XOR) with respect to the selected codeword from PROM II 817. The result supplies FHT IV 819 with the necessary information for it to compute the eight branch metrics from the selected state $s'_2$, as described above, to all of the eight states at level $S_1$. The eight branch metrics are next sent to a Bank of Eight Adders circuit 821 which is identical to the Bank of Eight Adders circuit 810 where path metrics are computed for paths beginning at the state $s_2'$ of level $S_2$, continuing through all eight states of level $S_1$ and on to initial state I. A Select Best of Eight circuit 822 chooses the path from level $S_2$ to initial state I having the highest path metric and outputs the highest path metric as $m_1'$ as well as the specific state $s_1'$ through which the highest metric path passes through on its way from $s_2'$ to I.

Single stage adder 823 next adds $m_1'$ and $m_2'$ to obtain the backward decoded highest path metric m' of all of the paths extending from final state F through the eight states of level $S_2$ further through the eight states of level $S_1$ and on to initial state I. The above operation performs Step 4 of the inventive decoding algorithm.

Next, the highest forward decoded path metric m and the highest backward decoded path metric m' are compared by comparator 824 which is similar to comparator 607 in FIG. 6. The highest of the two metrics is selected by a multiplexer MUX 825 which receives the two path metrics m and m' as data inputs along lines 834 and 835, respectively. Thus, the MUX 825 allows the highest valued metric of m and m' to be produced on the MUX 825 output line 836 as the value $M_i$.

The arrangement of multiplexers MUX 826, 827 and 831 and look-up tables 828, 829, 830 and 832 is instrumental in defining the specific path through the three-stage trellis which corresponds to the highest path metric. These multiplexers also find estimates for the information bits 1 through 9 shown in FIG. 6 that are latched in latch 606 and thus perform the final decoding step.

First of all, the output of comparator 824 is supplied as a control input to multiplexers 826 and 827. Multiplexer 826 is supplied with the three bits $s_1$ which are output from the Select Best Of Eight circuit 806. The multiplexer 826 is supplied with a second data input composed of the three bits $s'_1$ output from the Select Best of Eight circuit 822 Depending on which signal, m or m', which is selected by the comparator 824, three bits representing either $s_1$ or $s_1'$, respectively, are output from the multiplexer 826 and form the information bits 4, 5 and 6 which are shown in FIG. 6 to be output of the bidirectional decoder 614 and inserted into the latch 606. This determination of bits 4, 5 and 6 indicates which are the eight states of level $S_1$ is to be used in the final decoded path through the trellis.

Similar to the above description with respect to multiplexer 826, multiplexer 827 receives a control input from the output of the comparator 824. The multiplexer 827 receives two data inputs, each consisting of three bits, representing the three bits $s_2$ output from the Select Best of Eight circuit 815 and the three bits $s'_2$ output from the Select Best of Eight circuit 814. The output of the comparator 824 supplies a control input to the multiplexer 27 to determine which of the groups of three bits, either $s_2$ or $s'_2$ is to be output from the multiplexer to form information bits 7, 8 and 9 which are shown in FIG. 6 to be output of the bi-directional decoder 614 and input to the latch 606. The information bits 7, 8 and 9 represent the path from the selected state $s_1$ of the eight states of the level $S_1$ to the selected state $s_2$ of the eight states of level $S_2$.

Thus, by deciding between the groups of bits $s_1$ and $s'_1$ and between the groups of bits $s_2$ and $s'_2$, a unique direction through the trellis diagram from initial point I to final point F, as shown in FIG. 4, is determined.

However, as stated above, each of the branches from, for example, initial point I to a point at level $S_1$ is made up of a pair of parallel branches. Each member of the pair has a unique sign, either positive or negative, to distinguish from the other member of the pair. When the FHT circuits 804, 812, 840 and 819 calculate the metrics, as describe above, the sign bits for each metric are extracted, as shown in FIG. 8.

The extracted sign bits are sent to corresponding lookup tables 828, 829, 830 and 832 in FIG. 8. Specifically, the eight sign bits indicated by 8 sign bits I output from the FHT I circuit 804 are sent as data inputs to a lookup table 828. The lookup table is a one bit column by eight bit row device and stores all of the eight sign bits that are output from the FHT I 804. In a similar manner, the lookup table 829 receives the eight sign bits III from the FHT III 812, the lookup table 830 receives the eight sign bits II from the FHT II 840, and the lookup table 832 receives the eight sign bits IV from the FHT IV 819. The bits 4, 5, 6, derived as described above, are sent to the lookup table 828 as address inputs, and a single bit is output of the lookup table 828 and this bit specifies which of the two branches in the pair of branches connecting initial point I in the trellis diagram of FIG. 4 to the preselected state $s_1$ or $s'_1$ in level $S_1$ (such pre-selected state determined by bits 4, 5 and 6) is to be selected. For example, if the bits 4, 5, and 6 are applied to the lookup table 828 as address inputs and a negative sign bit is output of the lookup table 828 as information bit 1, then this specifies that of the two branches in the pair of branches connecting initial state I to the preselected state in level $S_1$, the branch in the pair which corresponds to the negative sign is to be chosen.

Similarly, the bits 7, 8, and 9 which are output of the MUX 827, as described above, are applied as address inputs to lookup table 829, which has the same construction as lookup table 828, and for that matter, lookup tables 830 and 832. When the bits 7, 8, and 9 are applied as address inputs to the lookup table 829, the lookup table 829 outputs a sign bit based on the information stored in the lookup table 829 which finds its source from the FHT III circuit 812 on the left hand side of FIG. 8. The output of the lookup table 829 is information bit 3 and, in an analogous fashion as the function of bit 1, bit 3 specifies which one out of the pre-selected pair of branches connecting the specified state in level $S_2$ to the final point F is to be chosen. The pair was preselected by the determination of bits 7, 8 and 9. Bit 3 tells which one of the pair, since there are two in a pair, is to be selected based on the sign data stored in the lookup table.

By looking at the arrangement of the FHT circuits in FIG. 8, it is clear that the first portion of the received word, such a first portion being indicated by $R'_1$, is only sent to one FHT circuit, that is, FHT I circuit 804. Likewise, the third group of eight bits, $R'_3$, of the received word, is always sent to the same FHT circuit, which is, FHT III circuit 812. For this reason, the outputs of the lookup tables 828 and 829, are directly assigned the values information bit 1 and information bit 3, respectively.

However, the second group of eight bits, $R'_2$, is applied to two different FHT circuits, namely, $R'_2$ is applied to FHT II circuit 840 and FHT IV circuit 819. For this reason, two separate lookup tables 830 and 832 are required in order to generate the information bit 2. Lookup table 830 receives the data group called 8 sign bits II which is output from the FHT II circuit 840 and lookup table 832 receives the data group called 8 sign bits IV output from FHT IV circuit 819. Bits 7, 8 and 9, which were described above, are used as address inputs to lookup table 830 and 832, and the lookup tables 830 and 832 output a single bit each to multiplexer 831 as data inputs. The multiplexer 831 receives a control input from the output of the comparator 824 and the output of the multiplexer 831 is assigned the value of information bit 2. Information bit 2 determines the particular branch out of the selected pair of branches connecting levels $S_1$ and $S_2$ which is to be used in the decided path through the trellis.

Therefore, in summary, decoded information bits 4, 5, and 6 specify the exact state out of the eight states in level $S_1$ which is to be connected to initial point I by a pair of parallel branches in the decided path through the trellis. Information bit 1 specifies exactly which one of the two branches making up the just mentioned pair is to be chosen. Further, information bits 7, 8, and 9 represent the exact state in level S which is to be used in forming a connection with the aforementioned state which was selected out of the eight states of level $S_1$. Information bit 2 specifies which one of the pair of parallel branches connecting the selected state in level $S_1$ and the selected state in the level $S_2$ is to be used. Finally, information bit 3 is used to specify which of the pair of branches connecting the selected state in level $S_2$ to the final point F is to be used. In this way, a most likely path is found through the three stage trellis of FIG. 4, and this most likely path represents the code word which is closest to the received word made up of portions $R'_1$, $R'_2$, and $R'_3$.

In the above arrangement it is to be noted that FHT II 840 and FHT IV 819 both compute metrics for $R'_2$. In order to produce a simpler structure using only three eight-point fast Hadamard transform calculators, an arrangement such as that shown in FIG. 12 has been invented. In FIG. 12, an Exchange and Shuffle circuit 1200 has been added to replace PROM II 817, MOD II 818 and FHT IV 819 in FIG. 8. FIG. 12 only shows the relevant portions of FIG. 8 that are being changed, and the surrounding portions of the system.

Figure 13:
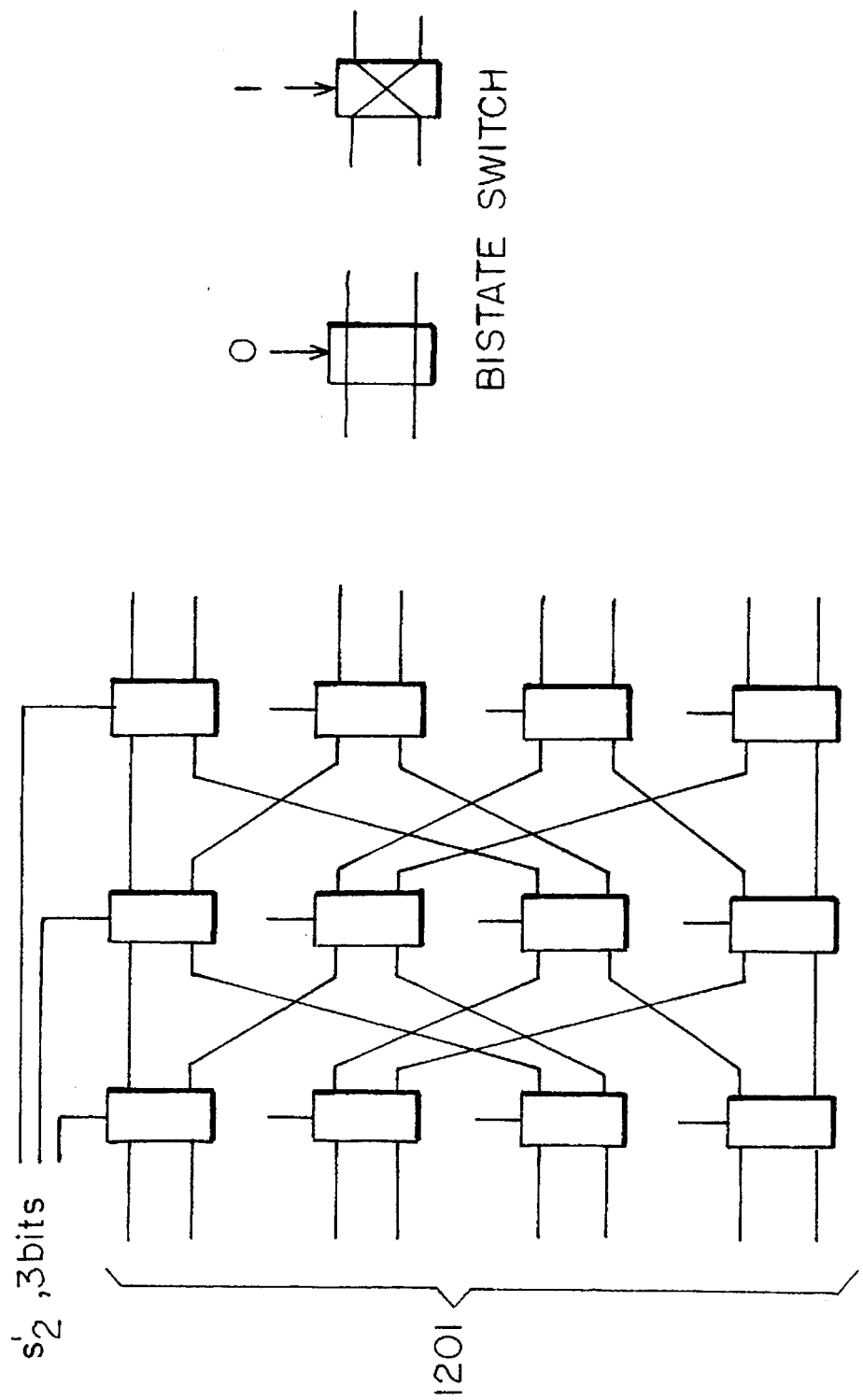
FIG. 13 shows an exchange and shuffle network of FIG. 12.

The Exchange and Shuffle circuit 1200 receives the three bit value indicating the specific state $s'_2$ in level $S_2$ that has been chosen by Selector 814. The circuit 1200 is made up of twelve two-state switches as shown in FIG. 13, such switches being turned on and off by the three bits $s'_2$ which are input to the switches as control inputs. The eight metrics computed by FHT II 840 are input to the Exchange and Shuffle Circuit 1200 along line 1201 where their order is rearranged by the circuit 1200. The rearranging of the order of the input metrics is based on the specific control input $s'_2$ supplied on line 1202. Thus, the Exchange and Shuffle circuit permutes the computed branch metrics into the arrangement of branch metrics for the branches stemming from state $s'_2$ in level $S_2$.

Figure 16:
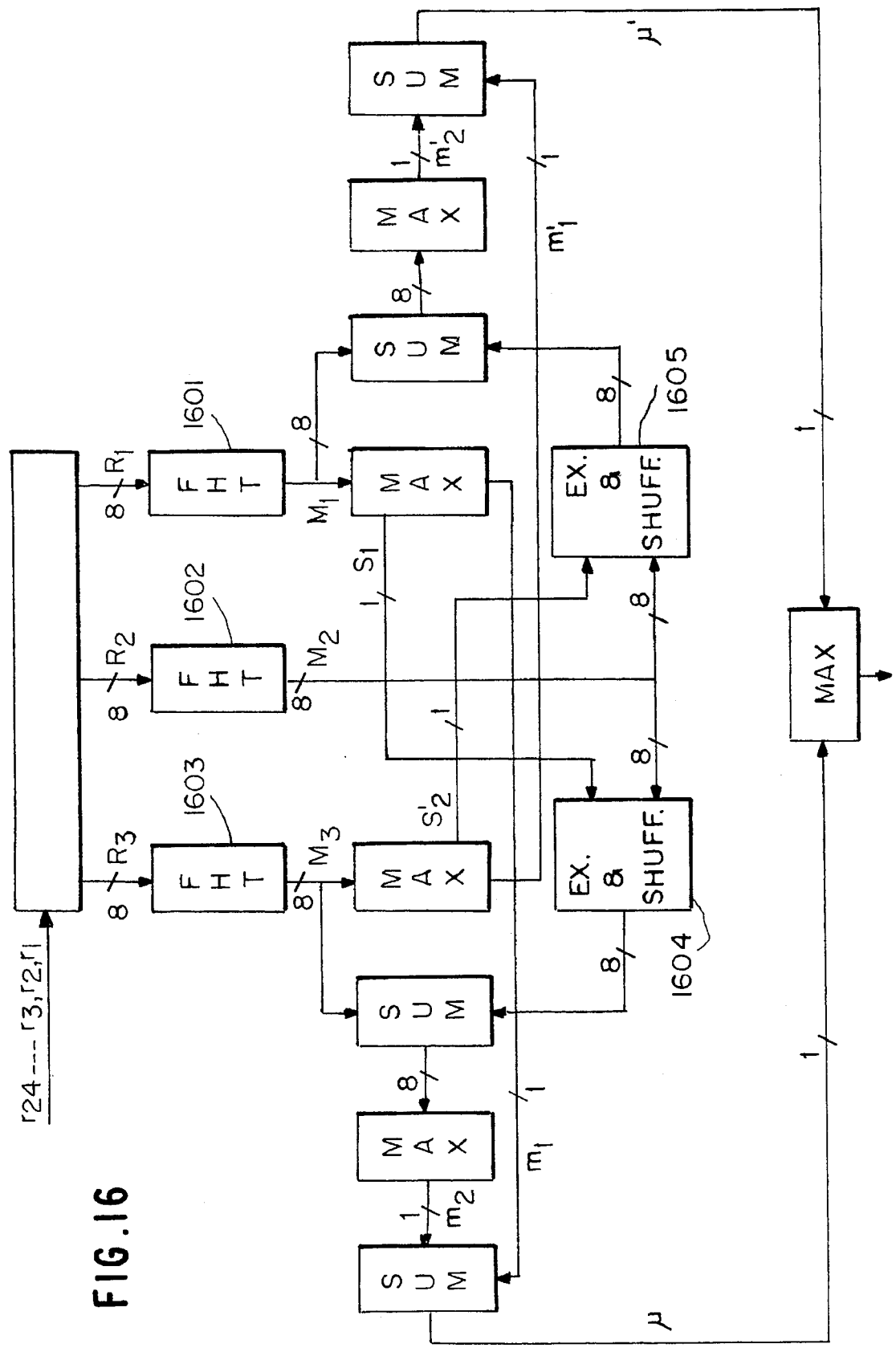
FIGS. 16 and 17 show additional embodiments of the bidirectional decoder

Alternate embodiments of the bi-directional decoder will now be described. FIG. 16 shows one such alternate embodiment with less complexity of implementation than the decoder embodiment shown in FIG. 8. In FIG. 16 the decoder is adapted for high-speed decoding situations since forward and backward decoding is carried out simultaneously.

As shown in FIG. 16 a received block of channel symbols is divided into three segments ($R_1$, $R_2$, and $R_3$) and sent to three different FHT units (1601, 1602 and 1603), respectively. The circuit arrangement is quite similar to that of FIG. 8. The "Max" circuits are the same as the "Select Best of Eight" circuits of FIG. 8. The "Sum" circuits are the same as the "Bank of Eight Adders" in FIG. 8.

FIG. 16 includes two Exchange and Shuffle Circuits, as opposed to the FIG. 12 modification of FIG. 8, such a FIG. 12 modification having only one such circuit. The eight metrics computed with respect to $R_2$ are input to both Exchange and Shuffle Circuits. One Exchange and Shuffle Circuit 1604 is for forward decoding and the other 1605 is for backward decoding. The outputs of the Exchange and Shuffle Circuits are sent to the Bank of Eight Adders (SUM) circuits in a similar fashion to the FIG. 12 circuit design.

Figure 17:
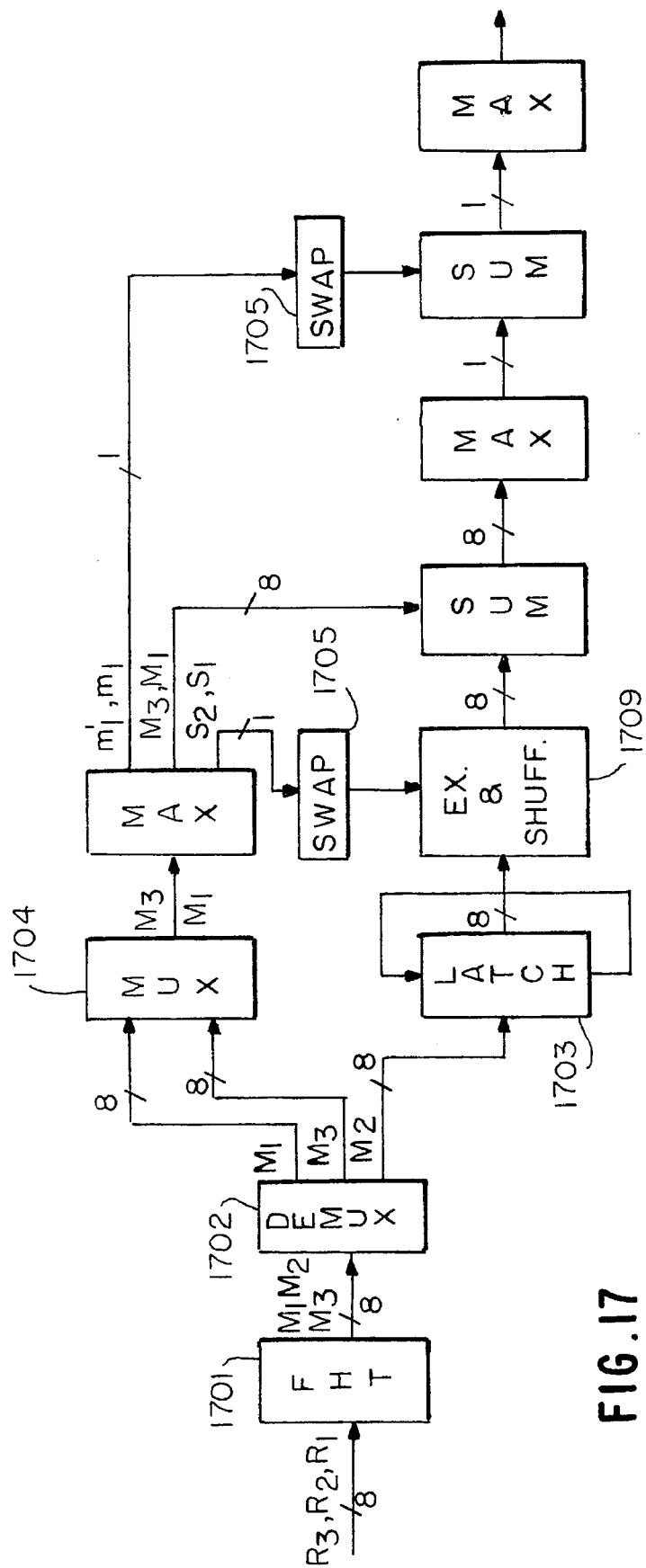

Another alternate embodiment of the bidirectional decoder is shown in FIG. 17. In this embodiment only one FHT is used instead of the three FHTs used in the FIG. 16 embodiment. The single FHT 1701 computes the metrics for all three group of eight channel symbols $R_3$, $R_2$ and $R_1$ in a serial fashion. This greatly reduces the complexity of the decoder. Only one Exchange and Shuffle Network 1709 is used. A demultiplexer (DEMUX) demultiplexes the three groups of metrics $M_3$, $M_2$ and $M_1$ and thus separates the groups. $M_2$ is sent to a latch 1703 for delay purposes and the output of the latch 1703 is sent to Exchange and Shuffle Circuit 1709. $M_1$ and $M_3$ are sent to a multiplexer 1704 where the two groups of eight metrics are combined. The add/compare/select hardware is also reduced by 50% using this implementation. The order in which states $s_1$ and $s_3$, or metrics $M_1$ and $M_3$ are generated is interchanged by SWAP circuits 1705 so that the Exchange and Shuffle Network can permute the set of metrics $M_2$ appropriately and the metrics in the forward and backward paths can be accumulated correctly. The embodiment of FIG. 17 results in a simplified circuit arrangement.

Table 2-1 shows the results of computer simulations for BER (bit error rate) performance evaluation of the bidirectional decoding algorithm B1 for the Extended Golay Code where N is the number of codewords simulated. The decoder operates with antipodal channel symbols, coherently detected in additive white Gaussian noise, with a 5 bit soft-decision uniform quantization. The last column of the table shows the number of bit errors made by a ML Viterbi algorithm decoder under exactly the same channel conditions. The small discrepancies between the performance of the two decoders are a result of the way in which ties are resolved. Also, a Viterbi decoder makes decisions by comparing metrics over the entire path while the bidirectional decoder makes decisions by comparing piecewise path metrics. The first column in Table 1, headed by the heading $E_b/N_o$, dB, is the information bit energy to noise density ratio.

TABLE 1

Computer Simulation Results for Decoding the Extended Golay Code

| $E_b/N_0$, dB | N | Number of Bit Errors | |
|---|---|---|---|
| | | Algorithm B1 | Viterbi Algorithm |
| 2 | 5,000 | 1,493 | 1,499 |
| 3 | 20,000 | 1,523 | 1,522 |
| 4 | 100,000 | 1,136 | 1,126 |
| 5 | 1,000,000 | 1,082 | 1,108 |

BLOCK CODES WITH A 4-STAGE TRELLIS DIAGRAM

Let $C_4=(4n, k, 2d)$ be a binary block code of length $4n$, dimension $k$ and minimum Hamming distance $2d$. Codewords in $C_4$ are the set of all linear combinations of rows of a generator matrix $G_4$ in the trellis oriented form, $$G_4 = \begin{bmatrix} G_1 & 0 & 0 & 0 \\ 0 & G_1 & 0 & 0 \\ 0 & 0 & G_1 & 0 \\ 0 & 0 & 0 & G_1 \\ G_2 & G_2 & 0 & 0 \\ 0 & G_2 & G_2 & 0 \\ 0 & 0 & G_2 & G_2 \end{bmatrix}$$

where $G_1$ is a $k_1$ row by $n$ column matrix and $G_2$ is a $k_2$ row by $n$ column matrix, and $k=4k_1+3k_2$. In general, entries represented by submatrices $G_1$ and $G_2$ in $G_4$ can be different. However, the above structure for $G_4$ is assumed to simplify illustration of the decoding algorithm.

Figure 14:
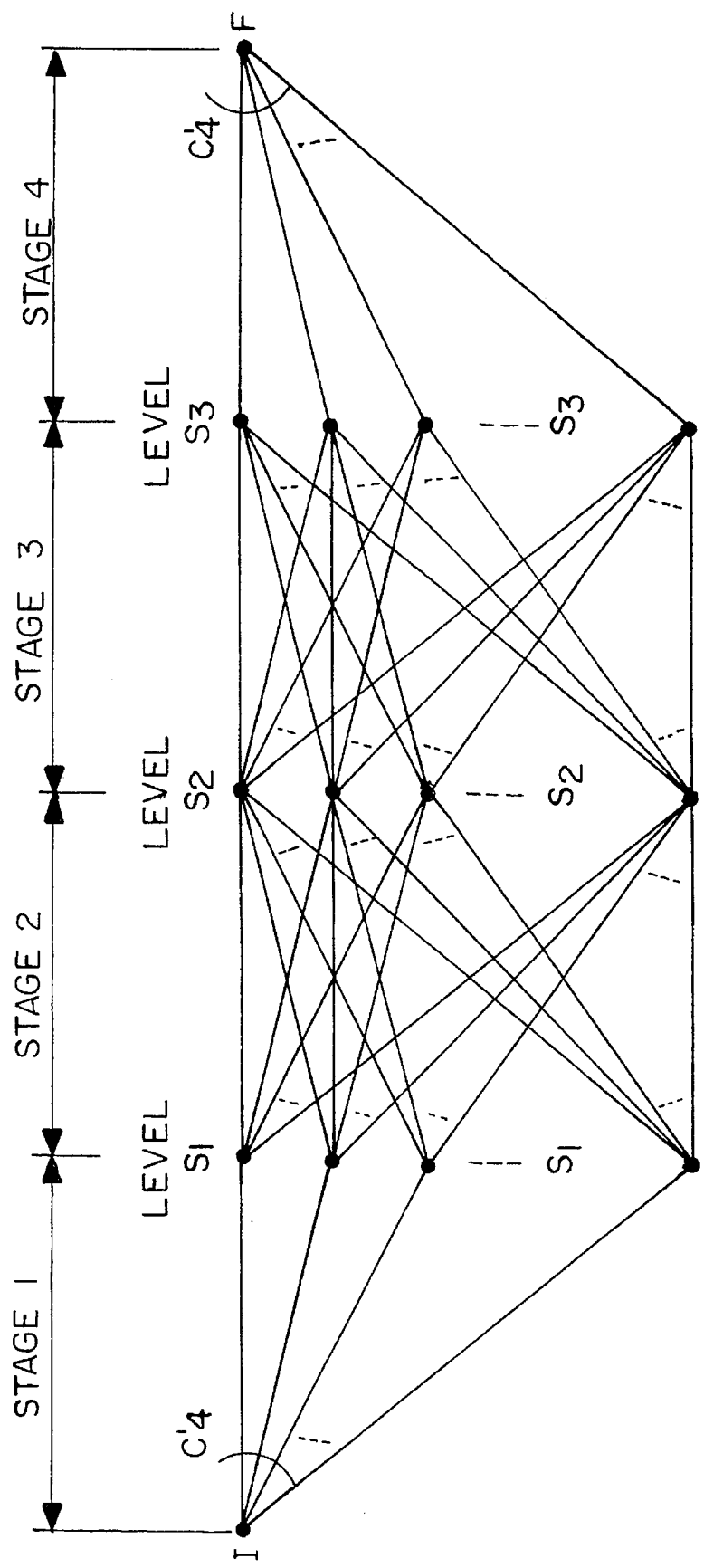
FIG. 14 shows a four stage trellis diagram to which the inventive decoding method is to be applied.

The set of all $2^k$ codewords generated by $G_4$ can be represented by a full-connected $2^{k_2}$-state 4-stage trellis diagram. Transitions between any two trellis states are by $2^{k_1}$ parallel branches, representing the $2^{k_1}$ codewords generated by $G_1$. FIG. 14 is a trellis diagram for $C_4$.

Subgenerator matrices $G_1$ and $G_2$ are selected so that $$G_4' = \begin{bmatrix} G_1 \\ G_2 \end{bmatrix}$$

generates a $C'_4=(n, k_1+k_2, d)$ code with a minimum Hamming distance $d$. $C'$ corresponds to the $2^{k_1+k_2}$ transitions stemming from or terminating in each trellis state, representing the $2^{k_1+k_2}$ codewords in $C'_4$.

Algorithm B2 is a modified version of algorithm B1 and achieves maximum likelihood decoding for codes having a generator matrix in the form of $G_4$.

Algorithm B2:

Let $R=(r_1, r_2, r_3, \ldots, r_{4n})$ be a received block corresponding to a codeword in $C_4$. Let $R_1=(r_1, r_2, \ldots, r_n)$, $R_2=(r_{n+1}, r_{n+2}, \ldots, r_{2n})$, $R_3=(r_{2n+1}, r_{2n+2}, \ldots r_{3n})$ and $R_4=(r_{3n+1}, r_{3n+2}, \ldots, r_{4n})$.

Step 1 Use an efficient ML algorithm for decoding $R_1$ in $C'_4$. The output of this step is a branch from the initial state I to an intermediate state $s_1$ of level $S_1$ and its corresponding metric is $m_1$.

Step 2 Assume that the decision made in Step 1 is correct Decode $R_2$ in $C'_4$. The output of this step is a branch from $s_1$ to an intermediate state $s_2$ at level $S_2$ and its corresponding metric is $m_2$.

Step 3 The intermediate state $s_2$ uniquely identifies the set of all paths from $s_2$ to the final state F. Decode $R_3R_4$ by computing metrics for every path from s to F and choose the path with the best metric, $m_3$. Let $s_3$ be the intermediate state from $s_2$ to F. Then, set $m=m_1+m_2+m_3$ and $D=(s_1, s_2, s_3)$.

Figure 15:
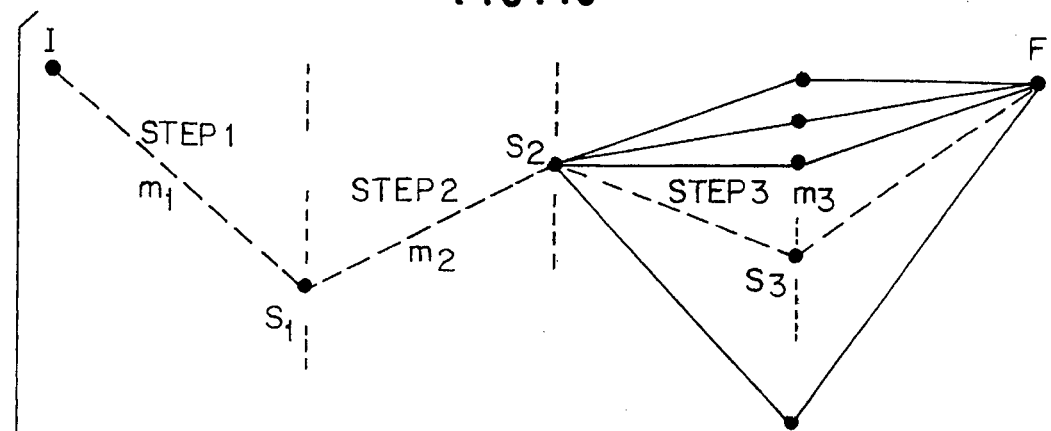
FIG. 15 shows the relationship between the decoding steps of the present invention and the trellis diagram of FIG. 14.
Figure 15:
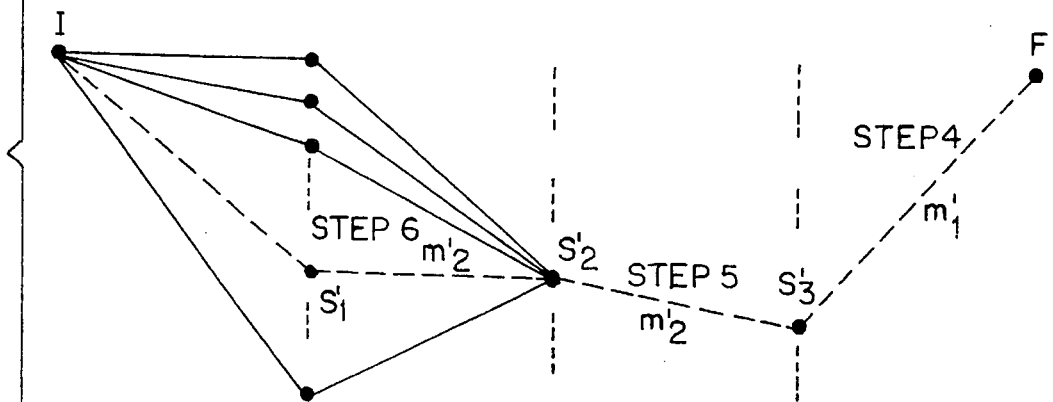
Figure 15:
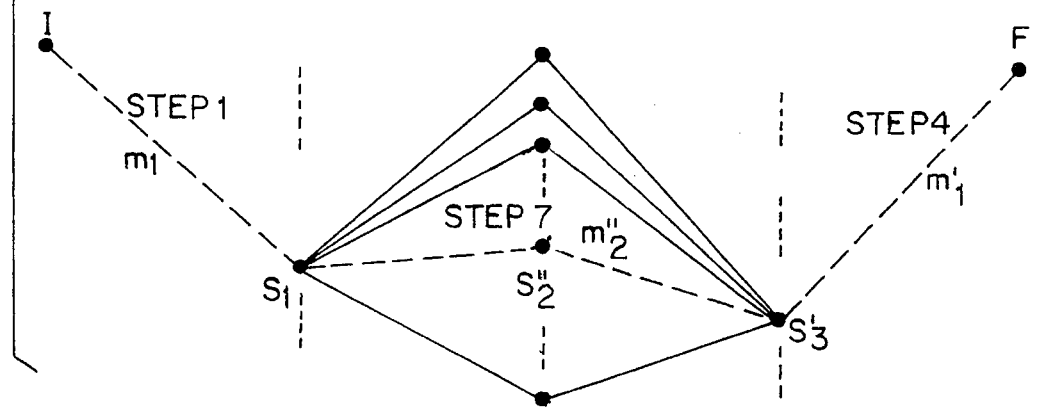

Step 4–6 Repeat Steps 1 through 3 but decoding R backwards, i.e., first decode $R_4$, then $R_3$, and then $R_1R_2$. Let $m'=m'_1+m'_2+m'_3$ be the metrics obtained and let $D'=(s'_1, s'_2, s'_3)$ be the selected path, where $m'_1$ is the metric for the path from F to $s'_3$, $m'_2$ is the metric for the path from $s'_3$ to $s'_2$ and $m'_3$ is the metric for the path from $s'_2$ to I as indicated in FIG. 15. If $m'>m$ set $m=m'$ and $D=D'$.

Step 7 Intermediate states $s_1$ and $s'_3$, obtained in Steps 1 and 4, uniquely specify the set of all possible paths from $s_1$ to $s'_3$. Decode $R_2R_3$ by computing metrics for all paths between these two states and select the best one, $m''_2$. Let $s''_2$ be the selected intermediate state between $s_1$ and $s'_3$. Let $M''=m_1+m'_1+m''_2$ and $D''=(s_1, s''_2, s'_3)$. If $m''>m$, then $D=D''$. Otherwise.

Step 8 Stop. D is the decoded path.

Regarding computational complexity, Algorithm B2 decodes the small code C' four times (in Steps 1, 2, 4, and 5) and processes only three states in the trellis diagram of FIG. 14 (in Steps 3, 6, and 7). A Viterbi algorithm decoder processes $2 \cdot 2^{k_2}+1$ states.

The scope of the invention is not to be limited by the above-described embodiments, but only by the appended claims.

What is claimed is:

1. In a decoder at a receive end of a communications link, a method of decoding a received block code representing information transmitted over said link, said method including the steps of:

generating a trellis diagram representing said received block code, said trellis diagram having first and second endpoints and a plurality of paths connecting said first and second endpoints, each path representing different information represented by said received block code;.

starting at said first endpoint and working toward said second endpoint, determining a first path of said plurality of paths which is most likely represented by said received block code;

starting at said second endpoint and working toward said first endpoint, determining a second path of said plurality of paths which is most likely represented by said received block code;

selecting one of said first and second paths as being represented by said received block code; and decoding said received block code in accordance with the selected path.

2. In a decoder at a receive end of a communications link, a method of decoding a received block code representing information transmitted over said link, said method including the steps of:

generating a trellis diagram representing said received block code, said trellis diagram having initial and final states and a plurality of paths connecting said initial and final states, each path representing different information represented by said received block code and each path being associated with a respective path metric related to the probability that each respective path is represented by said received block code;

finding a first of said plurality of paths from said initial state to said final state associated with a highest respective path metric;

finding a second of said plurality of paths from said final state to said initial state associated with a highest respective path metric;

comparing the path metrics of said first and second paths;

selecting, as the path most likely represented by said received block code, and in response to the results of said comparing step, whichever of the first or second paths has the higher path metric; and decoding said block code in accordance with the selected path.

3. In a decoder at a receive end of a communications link, a method of decoding a received block code representing information transmitted over said link, said method including the steps of:

generating a trellis diagram representing said received block code, said trellis diagram having initial and final points, and a plurality of paths connecting said initial and final points and a plurality of intermediate points, with each path formed of a plurality of branches each connecting successive points in said trellis, each path representing different information represented by said received block code, each branch being associated with a respective branch metric relating to a probability that the respective branch is a correct path portion, and each path being associated with a respective path metric related to the probability that each respective path is represented by said received block code;

finding a first branch, extending from said initial point to a first intermediate point, having a highest branch metric of all branches extending from said initial point toward said final point;

finding a first path, extending from said first intermediate point to said final point, having a highest path metric of all paths extending from said first intermediate point to said final point;

adding the branch metric of said first branch to the path metric of said first path to obtain a first sum;

finding a second branch, extending from said final point to a second intermediate point, having a highest branch metric of all branches extending from said final point toward said initial point;

finding a second path, extending from said second intermediate point through at least one further intermediate point to said initial point, having the highest path metric of all paths extending from said second intermediate point to said initial point;

adding the branch metric of said second branch to the path metric of said second path to obtain a second sum;

comparing the first and second sums;

selecting, in response to said comparing step, a path from said initial point to said final point as a path most likely represented by said received block code; and decoding said received block code in accordance with the selected path.

* * * * *